United States Patent
Ren et al.

(10) Patent No.: US 9,431,209 B2
(45) Date of Patent: Aug. 30, 2016

(54) APPARATUS OF PLURAL CHARGED PARTICLE BEAMS WITH MULTI-AXIS MAGNETIC LENSES

(71) Applicant: Hermes-Microvision, Inc., Hsinchu (TW)

(72) Inventors: Weiming Ren, San Jose, CA (US); Xuerang Hu, San Jose, CA (US); Xuedong Liu, San Jose, CA (US); Zhongwei Chen, San Jose, CA (US)

(73) Assignee: HERMES-MICROVISION, INC., Hsinchu (TW)

( * ) Notice: Subject to any disclaimer, the term of this patent is extended or adjusted under 35 U.S.C. 154(b) by 0 days.

(21) Appl. No.: 14/833,583

(22) Filed: Aug. 24, 2015

(65) Prior Publication Data
US 2016/0064180 A1    Mar. 3, 2016

Related U.S. Application Data

(60) Provisional application No. 62/042,378, filed on Aug. 27, 2014.

(51) Int. Cl.
| | |
|---|---|
| *H01J 37/00* | (2006.01) |
| *H01J 37/141* | (2006.01) |
| *H01J 37/147* | (2006.01) |
| *H01J 37/28* | (2006.01) |

(52) U.S. Cl.
CPC .......... *H01J 37/141* (2013.01); *H01J 37/1475* (2013.01); *H01J 37/28* (2013.01); *H01J 2237/141* (2013.01); *H01J 2237/1526* (2013.01); *H01J 2237/28* (2013.01)

(58) Field of Classification Search
USPC ............. 250/306, 307, 396 R, 396 ML, 398, 250/492.1, 492.2, 492.3
See application file for complete search history.

(56) References Cited

U.S. PATENT DOCUMENTS

| | | | |
|---|---|---|---|
| 3,715,580 | A | 2/1973 | Saitou et al. |
| 6,787,780 | B2 | 9/2004 | Hamaguchi et al. |
| 7,253,417 | B2 | 8/2007 | Frosien et al. |
| 7,262,418 | B2 | 8/2007 | Lo et al. |
| 8,003,953 | B2 | 8/2011 | Chen et al. |
| 8,294,095 | B2 | 10/2012 | Chen et al. |
| 8,445,862 | B2 | 5/2013 | Chen et al. |
| 2013/0153782 | A1 | 6/2013 | Ren et al. |

OTHER PUBLICATIONS

Zhongwei Chen et al., U.S. Appl. No. 61/872,205, filed Aug. 30, 2013.
Zhongwei Chen et al., U.S. Appl. No. 61/919,217, filed Dec. 20, 2013.

*Primary Examiner* — Nicole Ippolito
*Assistant Examiner* — Hanway Chang
(74) *Attorney, Agent, or Firm* — WPAT, PC; Justin King

(57) ABSTRACT

A new apparatus of plural charged particle beams with multi-axis magnetic lenses is provided, which comprises a plurality of sub-columns The apparatus employs two modified multi-axis magnetic lenses, and magnetic sub-lenses thereof therefore function as the objective lenses and the condenser lenses of all the sub-columns respectively. The plurality of sub-columns can perform the same function or different functions required for observing a surface of a specimen, such as high-throughput inspection and high-resolution review of interested features thereon. Accordingly, the apparatus can be used as a yield management tool in semiconductor manufacturing industry.

33 Claims, 12 Drawing Sheets

APPARATUS OF PLURAL CHARGED PARTICLE BEAMS WITH MULTI-AXIS MAGNETIC LENSES

CLAIM OF PRIORITY

This application claims the benefit of priority of U.S. provisional application No. 62/042,378 entitled to Ren et al. filed Aug. 27, 2014 and entitled "Apparatus of Plural Charged Particle Beams with Multi-axis Magnetic Lenses", the entire disclosures of which are incorporated herein by reference.

CROSS REFERENCE TO RELATED APPLICATIONS

This application is related to U.S. application Ser. No. 13/464,261 entitled to Ren et al. filed May 4, 2012, entitled "Multi-axis Magnetic Lens for focusing a plurality of Charged Particle Beams", and now issued U.S. Pat. No. 9,000,394, and a U.S. application Ser. No. 13/895,452 entitled to Ren et al. filed May 16, 2013 now issued U.S. Pat. No. 8,791,425 which is a divisional of U.S. Pat. No. 9,000,394. The entire disclosures of which are incorporated herein by reference.

This application is also related to provisional application No. 61/872,205 entitled to Chen et al. filed Aug. 30, 2013, which is pending U.S. application Ser. No. 14/468,674 filed Aug. 26, 2014, entitled "Apparatus of Plural Charged Particle Beams with Multi-axis Magnetic Lens", and now issued U.S. Pat. No. 9,105,440. The entire disclosures of which are incorporated herein by reference.

This application is also related to provisional application No. 61/919,217 entitled to Chen et al. filed Dec. 20, 2013, which is pending U.S. application Ser. No. 14/572,052 filed Dec. 16, 2014, entitled "Multi-axis Magnetic Lens for Focusing a Plurality of Charged Particle Beams", and the entire disclosures of which are incorporated herein by reference.

BACKGROUND OF THE INVENTION

1. Field of the Invention

The present invention relates to a multi-axis magnetic lens and variants thereof which can focus a plurality of charged particle beams individually and in parallel. More particularly, it relates to an apparatus of plural charged particle beams with two or more multi-axis magnetic lenses, which can inspect and/or review defects on a wafer or a mask with high resolution and high throughput in semiconductor manufacturing industry.

2. Description of the Prior Art

For manufacturing semiconductor IC chips, pattern defects and/or uninvited particles (residuals) inevitably appear on a wafer and or a mask during fabrication processes, which reduce the yield to a great degree. As requirements on chip performance are rising, smaller and smaller critical feature dimensions of patterns have to be used, and hence the yield management tools with optical beam have gradually become incompetent. Meanwhile, the yield management tools, each of which is based on the principle of scanning electron microscope (SEM) with a single electron beam, have been more and more used to inspect or review the defects or particles. The reason is that an electron beam can offer superior spatial resolution compared to a photon beam due to its short wavelength. However, such a superior spatial resolution will be fundamentally deteriorated by electron interaction or called as Coulomb Effect as the single electron beam current is increased to obtain a high throughput competent for mass production.

For mitigating the limitation on throughput, a promising solution is to use a plurality of electron beams each with a small current instead of using a single electron beam with a large current. For this solution, the plurality of electron beams can be respectively focused by a plurality of single-axis magnetic/electrostatic lenses in a conventional manner or a plurality of magnetic sub-lenses of a multi-axis magnetic lens as Maekawa et al first proposed in the U.S. Pat. No. 3,715,580 as early as in 1971. Compared with the first way, the later way can even halve the interval between every two adjacent beams, thereby almost doubling the throughput.

FIGS. 1A and 1B respectively illustrate the configuration and the magnetic field distribution of the conventional multi-axis magnetic lens 100 proposed in U.S. Pat. No. 3,715,580. When an electric current is exerted into the common excitation coil 44, an axisymmetric magnetic field (round-lens field) will be formed by one of a plurality of pairs of coaxial-through-round holes inside the parallel magnetic conductor plates 41 and 42 and distribute along the coincident central axes thereof (such as 31 in FIG. 1B), and consequently one magnetic sub-lens such as 30 is formed thereby. The yoke 43 surrounds the common excitation coil 44 to reduce the magnetic resistance so that more magnetic flux will leak out through each pair of coaxial-through-round holes.

There are two issues deteriorating the performance of the conventional multi-axis magnetic lens. The magnetic flux leaked out through each pair of coaxial-through-round holes depends on the position thereof, geometrical shapes and magnetic permeability of the plates 41 and 42, and the distribution of all the pairs of coaxial-through-round holes. Hence, as the first issue, each magnetic sub-lens further comprises a lot of non-axisymmetric transverse magnetic field components or called as high order harmonics (such as dipole field and quadrupole field). Only the round-lens field is necessary for focusing an electron beam, and the other components are undesired due to generating additional aberrations. To compensate the influence of each high order harmonic, at least one additional element generating the same type field component is required and thereby increasing the volume and the complication of the multi-axis magnetic lens obviously. As the second issue, all the magnetic sub-lenses are different in the round-lens fields even if all the pairs of coaxial-through-round holes are same in geometry. A magnetic sub-lens closer to the geometrical center of the plates 41 and 42, has a weaker round-lens field. For example, the magnetic sub-lens 20 has a weaker round-lens field than the magnetic sub-lens 10. The differences in round-lens field incur the differences in beam focusing with respect to a specific imaging plane. That means the beams 1, 2 and 3 respectively passing through the magnetic sub-lenses 10, 20 and 30 will not be focused onto a same plane even if they are incident in the same situation.

Chen et al propose one method in U.S. Pat. No. 8,003,953 and the first application of the cross reference to fundamentally mitigate or even eliminate the high order harmonics per se of each magnetic sub-lens and the differences among round-lens fields of all the magnetic sub-lenses. The method comprises three principal steps as expressed by the multi-axis magnetic lens 200 shown in FIG. 2A. The first step, as the most profound step, is inserting a magnetic round ring (such as 12) inside each through hole of every magnetic sub-lens (such as 10) with a radial gap (such as 14). The radial gap can be vacuum or filled of non-magnetic or weakly-magnetic material, which keeps a strong magnetic coupling between the magnetic round ring and the corresponding magnetic conductor plate and effectively weakens the non-axisymmetry of the distribution of magnetic scalar potential inside the magnetic round ring. Consequently, a magnetic field will be leaked out through the magnetic-circuit gap (such as 15) between the two magnetic round rings (such as 12 and 13) and distributes along the coincident central axes (such as 11) thereof. Out of the magnetic field, the axisymmetric component (round-lens field) is strong enough and the non-axisymmetric transverse field components are almost eliminated. With this way, the through holes are not necessary round in shape. The magnetic sub-lens module with respect to the magnetic sub-lens therefore is formed by the pair of through holes, the magnetic round rings therein, the radial gaps therebetween and the magnetic-circuit gap. The magnetic round rings functionally are magnetic pole-pieces and can flexibly shape the magnetic circuit gap for a specific application, such as an axial magnetic-circuit gap of a magnetic condenser sub-lens or a radial magnetic-circuit gap of a magnetic immersion objective sub-lens.

The second step is extending one of the two magnetic round rings of each magnetic sub-lens into the other so as to further eliminate the high order harmonics therebetween. If the extended magnetic round ring fully goes through the through hole in which the other magnetic round ring is inserted, in some cases the other magnetic round ring can even be removed for the sake of simplification in manufacturing. In the sub-lens 10 of the multi-axis magnetic lens 201 shown in FIG. 2B, the upper magnetic round ring 12 fully crosses over the upper and lower through holes. When working as an immersion objective lens with very short working distance (the gap between the objective lens and the sample), the lower magnetic round ring 13 therefore can be removed for the sake of simplification in manufacturing. The third step, as one global magnetic-shielding means, is placing two magnetic-shielding plates 51 and 52 respectively above and below the two parallel magnetic conductor plates 41 and 42 shown in FIG. 2A so as to reduce the high order harmonics of every magnetic sub-lens in the areas above and below the multi-axis magnetic lens 201 respectively. Furthermore, the differences of the radial gaps of all the magnetic sub-lens modules can be specifically designed to mitigate or even eliminate the round-lens field differences among all the magnetic sub-lenses.

Therefore, each magnetic sub-lens of the multi-axis magnetic lenses proposed by Chen et al can provide a performance as good as a conventional single-axis magnetic lens. In addition, Chen et al further propose a way to keep the performance stable for a specific application, as shown in FIG. 3 and disclosed in the third application of the cross reference. Instead of using the common excitation coil to provide a common magnetic flux, an annular permanent-magnet unit 45 provides a basic magnetic flux to all the magnetic sub-lenses modules and a plurality of subsidiary coils (such as 18) is respectively excited to provide an additional magnetic flux to one of the magnetic sub-lens modules (such as 10). This configuration weakens the factors which vary the magnetic field of each magnetic sub-lens, such as the variation of the coil excitation (product of coil turns T and coil current I) and thermal deformation. For the sake of clarity, a modified multi-axis magnetic lens means any of the multi-axis magnetic lenses proposed by Chen et al. and a conventional multi-axis magnetic lens means any of the other prior-art multi-axis magnetic lenses hereafter.

Generally speaking, a multi-axis magnetic lens can be used as an objective lens, a condenser lens and a transfer lens and hence an apparatus of plural charged particle beams can use one or more multi-axis magnetic lenses such as U.S. Pat. Nos. 7,262,418, 7,253,417 and 6,787,780. However, for a conventional multi-axis magnetic lens, the impact of the first issue mentioned above will be more sever when functioning as a condenser lens or a transfer lens than as an objective lens due to incurring much larger off-axis aberrations on each beam path. Comparably, a modified multi-axis magnetic lens can perform better because it can effectively mitigate or even eliminate the first issue. Accordingly, an apparatus of plural charged particle beams, which employs two modified multi-axis magnetic lenses as the objective lens and the condenser lens respectively, will provide higher resolutions and higher throughputs than those of the yield management tools of the prior art. For the sake of simplification and clarity, hereafter a multi-axis magnetic objective lens means a multi-axis magnetic lens whose magnetic sub-lenses respectively functions as an objective lens, while a multi-axis magnetic condenser lens means a multi-axis magnetic lens whose magnetic sub-lenses respectively functions as a condenser objective lens.

SUMMARY OF THE INVENTION

On the basis of the fundamental of U.S. Pat. Nos. 8,003,953, 8,294,095 and 8,445,862 and the cross-references, the object of this invention is to provide a new apparatus of plural charged particle beams, which can provide both high resolutions and high throughputs as a yield management tool in semiconductor manufacturing industry. The apparatus of plural charged particle beams employs a modified multi-axis magnetic objective lens and a modified multi-axis magnetic condenser lens. Compared with a prior-art yield management tool, which employs a conventional multi-axis magnetic objective lens and a conventional multi-axis magnetic condenser or a plurality of individual electrostatic condenser lenses, the new apparatus will provide higher resolutions and higher throughputs.

Accordingly, the invention therefore provides an apparatus of plural charged particle beams, which comprises a specimen stage for sustaining a specimen thereon, and multiple sub-columns above the specimen stage. Each of the multiple sub-columns performs a function for observing an observed surface of the specimen and comprises a charged particle source unit for providing a primary charged particle beam propagating along an optical axis of the each sub-column, a magnetic condenser lens under the charged particle source unit and aligned with the optical axis, a beam-limit aperture plate having at least one first opening and under the magnetic condenser lens, a signal-charged-particle detector under the beam-limit aperture plate, a deflection scanning unit and a magnetic objective lens both under the signal-charged-particle detector and aligned with the optical axis. One of that at least one first opening is aligned with the optical axis and therefore functions as a beam-limit aperture. The magnetic condenser lens focuses the primary charged particle beam to get a desired current thereof after passing through the beam-limit aperture, the magnetic objective lens focuses the primary charged particle beam onto the observed surface, the signal-charged-particle detector detects secondary charged particle beam emanated from the observed surface where the primary charged particle beam impinges, and the deflection scanning unit deflects the primary charged particle beam to scan the observed surface so that an image thereof can be obtained. Each of that magnetic objective lenses of the multiple sub-columns is one magnetic objective sub-lens of a multi-axis magnetic objective lens. The multi-axis magnetic objective lens comprises a pair of parallel first magnetic conductor plates with a plurality of first through holes in pairs therein, a plurality of first magnetic round rings in pairs, and a first annular magnetic-flux excitation unit. Each pair of that first through holes comprises a first upper hole and a first lower hole, which are respectively inside a first upper plate and a first lower plate of the pair of parallel first magnetic conductor plates and aligned with the optical axis of that each sub-column. Each pair of the first magnetic round rings comprises a first upper ring and a first lower ring, which are inside, aligned and form a first upper radial gap and a first lower radial gap with the first upper and lower holes of one pair of the first through holes respectively, and the first upper and lower radial gaps are vacuum or filled of non-magnetic or weakly-magnetic material. The first annular magnetic-flux excitation unit, between the first upper and lower plates, has an inner outline which encloses the plurality of first through holes in pairs in radial dimensions. One pair of the first through holes, one pair of the first magnetic round rings therein and a first magnetic-circuit gap between the first upper and lower rings thereof therefore forms one magnetic objective sub-lens module, and the first annular magnetic-flux excitation unit provides a first magnetic flux to each magnetic objective sub-lens module which therefore becomes the one magnetic objective sub-lens. Each of the magnetic condenser lenses of the multiple sub-columns is one magnetic condenser sub-lens of a multi-axis magnetic condenser lens. The multi-axis magnetic condenser lens comprises a pair of parallel second magnetic conductor plates with a plurality of second through holes in pairs therein, a plurality of second magnetic round rings in pairs, and a second annular magnetic-flux excitation unit. Each pair of the second through holes comprises a second upper hole and a second lower hole, which are respectively inside a second upper plate and a second lower plate of the pair of parallel second magnetic conductor plates and aligned with the optical axis of that each sub-column. Each pair of the second magnetic round rings comprises a second upper ring and a second lower ring which are inside, aligned and form a second upper radial gap and a second lower radial gap with the second upper and lower holes of one pair of the second through holes respectively, and the second upper and lower radial gaps are vacuum or filled of non-magnetic or weakly-magnetic material. The second annular magnetic-flux excitation unit, between the second upper and lower plates, has an inner outline which encloses the plurality of second through holes in pairs in radial dimensions. One pair of the second through holes, one pair of the second magnetic round rings therein and a second magnetic-circuit gap between the second upper and lower rings thereof therefore forms one magnetic condenser sub-lens module, and the second annular magnetic-flux excitation unit provides a second magnetic flux to each magnetic condenser sub-lens module which therefore becomes the one magnetic condenser sub-lens.

In this embodiment of the present invention, for that each sub-column, a lower end of the first upper ring extends downward into the first lower ring and therefore makes the first magnetic-circuit gap close to the observed surface, and an upper end of the second lower ring extends upward into the second upper ring and therefore makes the second magnetic-circuit gap close to the charged particle source unit.

In this embodiment of the present invention, the apparatus of plural charged particle beams may further comprise a first upper magnetic-shielding plate which is placed above the first upper plate with a first upper axial gap and has a plurality of first upper through circular openings each aligned with the optical axis of that each sub-column so as to reduce high order harmonics of that each magnetic objective sub-lens. The apparatus of plural charged particle beams may further comprise a first lower magnetic-shielding plate which is placed below the first lower plate with a first lower axial gap and has a plurality of first lower through circular openings each aligned with the optical axis of that each sub-column so as to reduce high order harmonics of that each magnetic objective sub-lens. The apparatus of plural charged particle beams may further comprise a second upper magnetic-shielding plate which is located above the second upper plate with a second upper axial gap and has a plurality of second upper through circular openings each aligned with the optical axis of that each sub-column so as to reduce high order harmonics of that each magnetic condenser sub-lens. The apparatus of plural charged particle beams may further comprise an second lower magnetic-shielding plate which is located below the second lower plate with a second lower axial gap and has a plurality of second lower through circular openings each aligned with the optical axis of that each sub-column so as to reduce high order harmonics of that each magnetic condenser sub-lens.

In this embodiment of the present invention, each sub-column may comprise a first magnetic-shielding tube which stands on the second upper magnetic-shielding plate and is aligned with the optical axis of that each sub-column so as to magnetically cover a portion of a path of the primary charged particle beam therein. Each sub-column may comprise a second magnetic-shielding tube which is placed beneath the second lower magnetic-shielding plate and aligned with the optical axis of that each sub-column so as to magnetically cover another portion of the path of the primary charged particle beam therein. Each sub-column may comprise a third magnetic-shielding tube which stands on the first upper magnetic-shielding plate and aligned with the optical axis of that each sub-column so as to magnetically cover another portion of the path of the primary charged particle beam therein. The apparatus of plural charged particle beams may further comprise a general magnetic-shielding tube which is sandwiched by the first upper magnetic shielding plate and the second lower magnetic shielding plate so as to magnetically cover portions of paths of primary charged particle beams of all of those sub-columns therein.

In this embodiment of the present invention, for that each sub-column, the deflection scanning unit may comprise an electrostatic deflector placed close to or inside the first magnetic-circuit gap.

In this embodiment of the present invention, each sub-column may comprise a control electrode placed above the observed surface, which has one circular orifice aligned with the optical axis of that each sub-column and is biased a control voltage with respect to the observed surface to control an electrostatic field thereon.

In this embodiment of the present invention, each sub-column may comprise a first sub-coil winding around the first upper ring and inside the first annular magnetic-flux excitation unit, which can be excited to provide a third magnetic flux to the magnetic objective sub-lens module.

Each sub-column comprises a second sub-coil winding around the second lower ring and inside the second annular magnetic-flux excitation unit, which can be excited to provide a fourth magnetic flux to the magnetic condenser sub-lens module. The first annular magnetic-flux excitation unit may comprise a first common coil. The second annular magnetic-flux excitation unit may comprise a second common coil. The first annular magnetic-flux excitation unit may comprise a first permanent magnet. The second annular magnetic-flux excitation unit may comprise a second permanent magnet.

The present invention also provides an apparatus of plural charged particle beams, which comprises a specimen stage for sustaining a specimen thereon, and multiple sub-columns above the specimen stage. Each of the multiple sub-columns performs a function for observing an observed surface of the specimen and comprises a charged particle source unit for providing a primary charged particle beam propagating along an optical axis of that each sub-column, a magnetic condenser lens under the charged particle source unit and aligned with the optical axis, a beam-limit aperture plate having at least one first opening and under the magnetic condenser lens, a signal-charged-particle detector under the beam-limit aperture plate, and a deflection scanning unit and a magnetic objective lens both under the signal-charged-particle detector and aligned with the optical axis. One of that at least one first opening is aligned with the optical axis and therefore functions as a beam-limit aperture. The magnetic condenser lens focuses the primary charged particle beam to get a desired current thereof after passing through the beam-limit aperture, the magnetic objective lens focuses the primary charged particle beam onto the observed surface, the signal-charged-particle detector detects secondary charged particle beam emanated from the observed surface where the primary charged particle beam impinges, and the deflection scanning unit deflects the primary charged particle beam to scan the observed surface so that an image thereof can be obtained. Each of the magnetic objective lenses of those multiple sub-columns is one magnetic objective sub-lens of a multi-axis magnetic objective lens. The multi-axis magnetic objective lens comprises a pair of parallel first magnetic conductor plates with a plurality of first through holes in pairs therein, a plurality of first magnetic round rings, and a first annular magnetic-flux excitation unit. Each pair of the first through holes comprises a first upper hole and a first lower hole, which are respectively inside a first upper plate and a first lower plate of the pair of parallel first magnetic conductor plates and aligned with the optical axis of that each sub-column. Each of the first magnetic round rings is inside, aligned and forms a first upper radial gap with the first upper hole of one pair of the first through holes, and the first upper radial gap is vacuum or filled of non-magnetic or weakly-magnetic material. The first annular magnetic-flux excitation unit, between the first upper and lower plates, has an inner outline which encloses the plurality of first through holes in pairs in radial dimensions. One pair of the first through holes, one of the first magnetic round rings therein and a first magnetic-circuit gap between the first magnetic round ring and the first lower hole of the pair of first through holes therefore forms one magnetic objective sub-lens module, and the first annular magnetic-flux excitation provides a first magnetic flux to each magnetic objective sub-lens module which therefore becomes that one magnetic objective sub-lens. Each of the magnetic condenser lenses of the multiple sub-columns is one magnetic condenser sub-lens of a multi-axis magnetic condenser lens. The multi-axis magnetic condenser lens comprises a pair of parallel second magnetic conductor plates with a plurality of second through holes in pairs therein, a plurality of second magnetic round rings in pairs, and a second annular magnetic-flux excitation unit. Each pair of the second through holes comprises a second upper hole and a second lower hole, which are respectively inside a second upper plate and a second lower plate of the pair of parallel second magnetic conductor plates and aligned with the optical axis of that each sub-column. Each pair of the second magnetic round rings comprises a second upper ring and a second lower ring which are inside, aligned and form a second upper radial gap and a second lower radial gap with the second upper and lower holes of one pair of the second through holes respectively, and the second upper and lower radial gaps are vacuum or filled of non-magnetic or weakly-magnetic material. The second annular magnetic-flux excitation unit, between the second upper and lower plates, has an inner outline which encloses the plurality of second through holes in pairs in radial dimensions. One pair of the second through holes, one pair of the second magnetic round rings therein and a second magnetic-circuit gap between the second upper and lower rings thereof therefore forms one magnetic condenser sub-lens module, and the second annular magnetic-flux excitation unit provides a second magnetic flux to each magnetic condenser sub-lens module which therefore becomes that one magnetic condenser sub-lens.

In this embodiment of the present invention, for one sub-column, a lower end of the first magnetic round ring extends downward into the first lower hole and therefore makes the first magnetic-circuit gap close to the observed surface. The sub-column may comprise a first sub-coil winding around the first magnetic round ring and inside the first annular magnetic-flux excitation unit, which can be excited to provide a third magnetic flux to the magnetic objective sub-lens module. For one sub-column, an upper end of the second lower ring extends upward into the second upper ring and therefore makes the second magnetic-circuit gap close to the charged particle source unit. The sub-column may comprise a second sub-coil winding around the second upper ring and inside the second annular magnetic-flux excitation unit, which can be excited to provide a fourth magnetic flux to the magnetic condenser sub-lens module.

The present invention still also provides an apparatus of plural charged particle beams, which comprises a specimen stage for sustaining a specimen thereon, and multiple sub-columns above the specimen stage. Each of the multiple sub-columns performs a function for observing an observed surface of the specimen and comprises a charged particle source unit for providing a primary charged particle beam propagating along an optical axis of that each sub-column, a magnetic condenser lens under the charged particle source unit and aligned with the optical axis, a beam-limit aperture plate having at least one first opening and under the magnetic condenser, a signal-charged-particle detector under the beam-limit aperture plate, and a deflection scanning unit and a magnetic objective lens both under the signal-charged-particle detector and aligned with the optical axis. One of that at least first opening is aligned with the optical axis and therefore functions as a beam-limit aperture. The magnetic condenser lens focuses the primary charged particle beam to get a desired current thereof after passing through the beam-limit aperture, the magnetic objective lens focuses the primary charged particle beam onto the observed surface, the signal-charged-particle detector detects secondary charged particle beam emanated from the observed surface where the primary charged particle beam impinges, and the deflection scanning unit deflects the primary charged particle beam to scan the observed surface so that an image thereof can be obtained. Each of the magnetic objective lenses of the multiple sub-columns is one magnetic objective sub-lens of a multi-axis magnetic objective lens. The multi-axis magnetic objective lens comprises a pair of parallel first magnetic conductor plates with a plurality of first through holes in pairs therein, a plurality of first magnetic round rings in pairs, and a first annular magnetic-flux excitation unit. Each pair of the first through holes comprises a first upper hole and a first lower hole, which are respectively inside a first upper plate and a first lower plate of the pair of parallel first magnetic conductor plates and aligned with the optical axis of that each sub-column. Each pair of the first magnetic round rings comprises a first upper ring and a first lower ring which are inside, aligned and form a first upper radial gap and a first lower radial gap with the first upper and lower holes of one pair of the first through holes respectively, and the first upper and lower radial gaps are vacuum or filled of non-magnetic or weakly-magnetic material. The first annular magnetic-flux excitation unit, between the first upper and lower plates, has an inner outline which encloses the plurality of first through holes in pairs in radial dimensions. One pair of the first through holes, one pair of the first magnetic round rings therein and a first magnetic-circuit gap between the first upper and lower rings thereof therefore forms one magnetic objective sub-lens module, and the first annular magnetic-flux excitation unit provides a first magnetic flux to each magnetic objective sub-lens module which therefore becomes the one magnetic objective sub-lens. Each of the magnetic condenser lenses of the multiple sub-columns is one magnetic condenser sub-lens of a multi-axis magnetic condenser lens. The multi-axis magnetic condenser lens comprises a pair of parallel second magnetic conductor plates with a plurality of second through holes in pairs therein, a plurality of second magnetic round rings, and a second annular magnetic-flux excitation unit. Each pair of the second through holes comprises a second upper hole and a second lower hole, which are respectively inside a second upper plate and a second lower plate of the pair of parallel second magnetic conductor plates and aligned with the optical axis of that each sub-column. Each of the second magnetic round rings is inside, aligned and forms a second lower radial gap with the second lower hole of one pair of the second through holes, and the second lower radial gap is vacuum or filled of non-magnetic or weakly-magnetic material. The second annular magnetic-flux excitation unit, between the second upper and lower plates, has an inner outline which encloses the plurality of second through holes in pairs in radial dimensions. One pair of the second through holes, one of the second magnetic round rings therein and a second magnetic-circuit gap between the second magnetic round ring and the second upper hole of the pair of second through holes therefore forms one magnetic condenser sub-lens module, and the second annular magnetic-flux excitation unit provides a second magnetic flux to each magnetic condenser sub-lens module which therefore becomes the one magnetic condenser sub-lens.

In this embodiment of the present invention, for one sub-column, a lower end of the first upper ring extends downward into the first lower ring and therefore makes the first magnetic-circuit gap close to the observed surface. The sub-column may comprise a first sub-coil winding around the first upper ring and inside the first annular magnetic-flux excitation unit, which can be excited to provide a third magnetic flux to the magnetic objective sub-lens module. For one sub-column, an upper end of the second magnetic round ring extends upward into the second upper hole and therefore makes the second magnetic-circuit gap close to the charged particle source unit. The sub-column may comprise a second sub-coil winding around the second magnetic round ring and inside the second annular magnetic-flux excitation unit, which can be excited to provide a fourth magnetic flux to the magnetic condenser sub-lens module.

The present invention also provides a method to configure an apparatus of plural charged particle beams, which comprises steps of providing a specimen stage for sustaining a specimen thereon, and providing multiple sub-columns above the specimen stage. Each of the multiple sub-columns performs a function for observing an observed surface of the specimen and comprises a charged particle source unit for providing a primary charged particle beam propagating along an optical axis of that each sub-column, a magnetic condenser lens under the charged particle source unit and aligned with the optical axis, a beam-limit aperture plate having at least one first opening and under the magnetic condenser, a signal-charged-particle detector under the beam-limit aperture plate, and a deflection scanning unit and a magnetic objective lens both under the signal-charged-particle detector and aligned with the optical axis. One of that at least one first opening is aligned with the optical axis and therefore functions as a beam-limit aperture. The magnetic condenser lens focuses the primary charged particle beam to get a desired current thereof after passing through the beam-limit aperture, the magnetic objective lens focuses the primary charged particle beam onto the observed surface, the signal-charged-particle detector detects secondary charged particle beam emanated from the observed surface where the primary charged particle beam impinges, and the deflection scanning unit deflects the primary charged particle beam to scan the observed surface so that an image thereof can be obtained. Each of the magnetic objective lenses of the multiple sub-columns is one magnetic objective sub-lens of a modified multi-axis magnetic objective lens. Each of the magnetic condenser lenses of the multiple sub-columns is one magnetic condenser sub-lens of a modified multi-axis magnetic condenser lens.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF EXAMPLE EMBODIMENTS

Figure 1A:
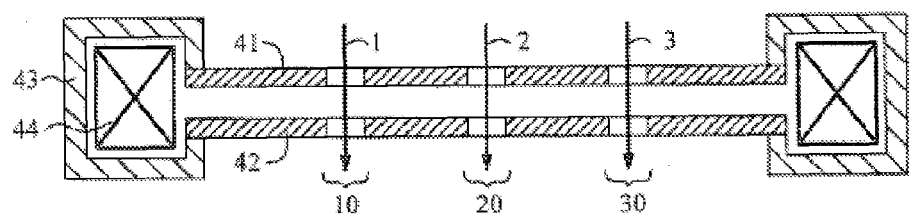
FIG. 1A is a schematic illustration of a configuration of a conventional multi-axis magnetic lens.
Figure 1B:
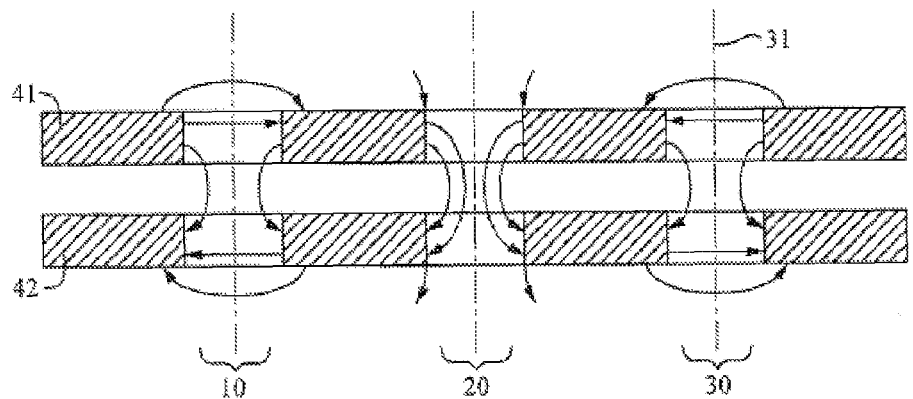
FIG. 1B is a schematic illustration of magnetic flux lines of the conventional multi-axis magnetic lens shown in FIG. 1A.
Figure 2A:
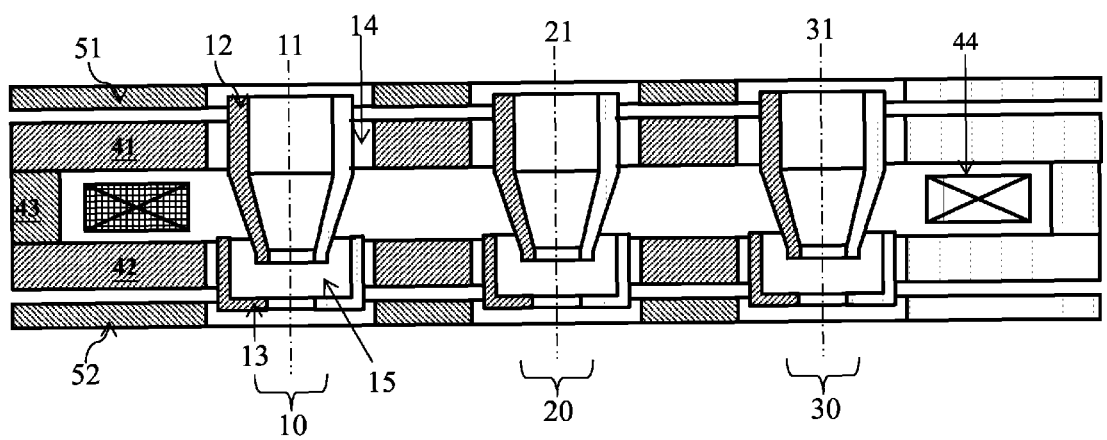
FIG. 2A is a schematic illustration of a modified multi-axis magnetic lens proposed in the U.S. Pat. No. 8,003,953.
Figure 2B:
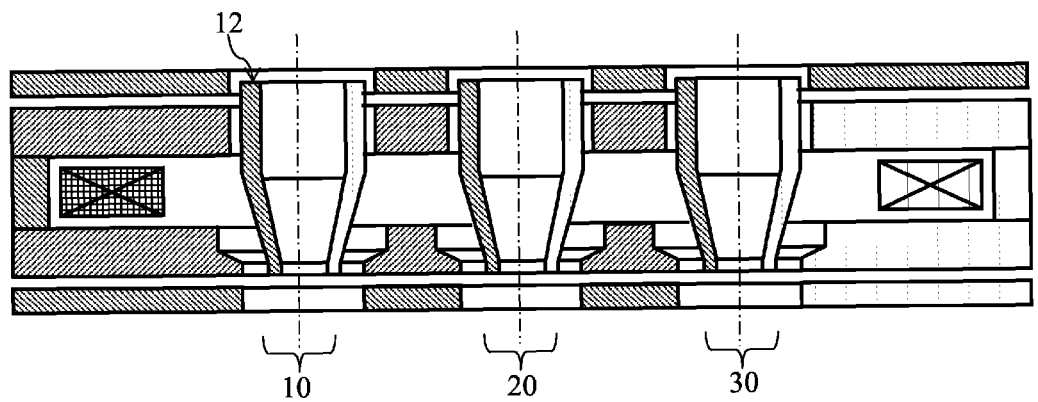
FIG. 2B is a schematic illustration of another modified multi-axis magnetic lens proposed in the first application of the cross-reference.

Various example embodiments of the present invention will now be described more fully with reference to the accompanying drawings in which some example embodiments of the invention are shown. Without limiting the scope of the protection of the present invention, all the description and drawings of the embodiments will exemplarily be referred to an electron beam. However, the embodiments are not be used to limit the present invention to specific charged particles.

In the drawings, relative dimensions of each component and among every component may be exaggerated for clarity. Within the following description of the drawings the same or like reference numbers refer to the same or like components or entities, and only the differences with respect to the individual embodiments are described.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention.

In this invention, "axial" means "in the optical axis direction of a lens or a sub-lens", while "radial" means "in a direction perpendicular to the optical axis of a lens or a sub-lens".

In this invention, all terms relate to through holes, openings or orifices mean openings or holes penetrated through one plate. Through holes always refer to holes in a magnetic conductor plate, and orifices always refer to holes in an electrode plate. A pair of though holes, two paired through holes or two through holes in pair mean two through holes which are respectively in two magnetic conductor plates and aligned with each other or simply called as being coaxial. For each magnetic sub-lens module, upper and lower through holes refer to the through holes in the upper and lower magnetic conductor plates respectively, and upper and lower pole-pieces refer to the magnetic round rings originally belong to the upper and lower through holes respectively.

In this invention, "weakly-magnetic" material means the permeability thereof is much smaller than that of magnetic material immediately surrounding it.

In this invention, the term "annular" means "being an enclosed shape".

Next, the present invention will provide some embodiments of a new apparatus of plural electron beams using two modified multi-axis magnetic lenses as the objective lens and the condenser lens respectively.

Figure 4:
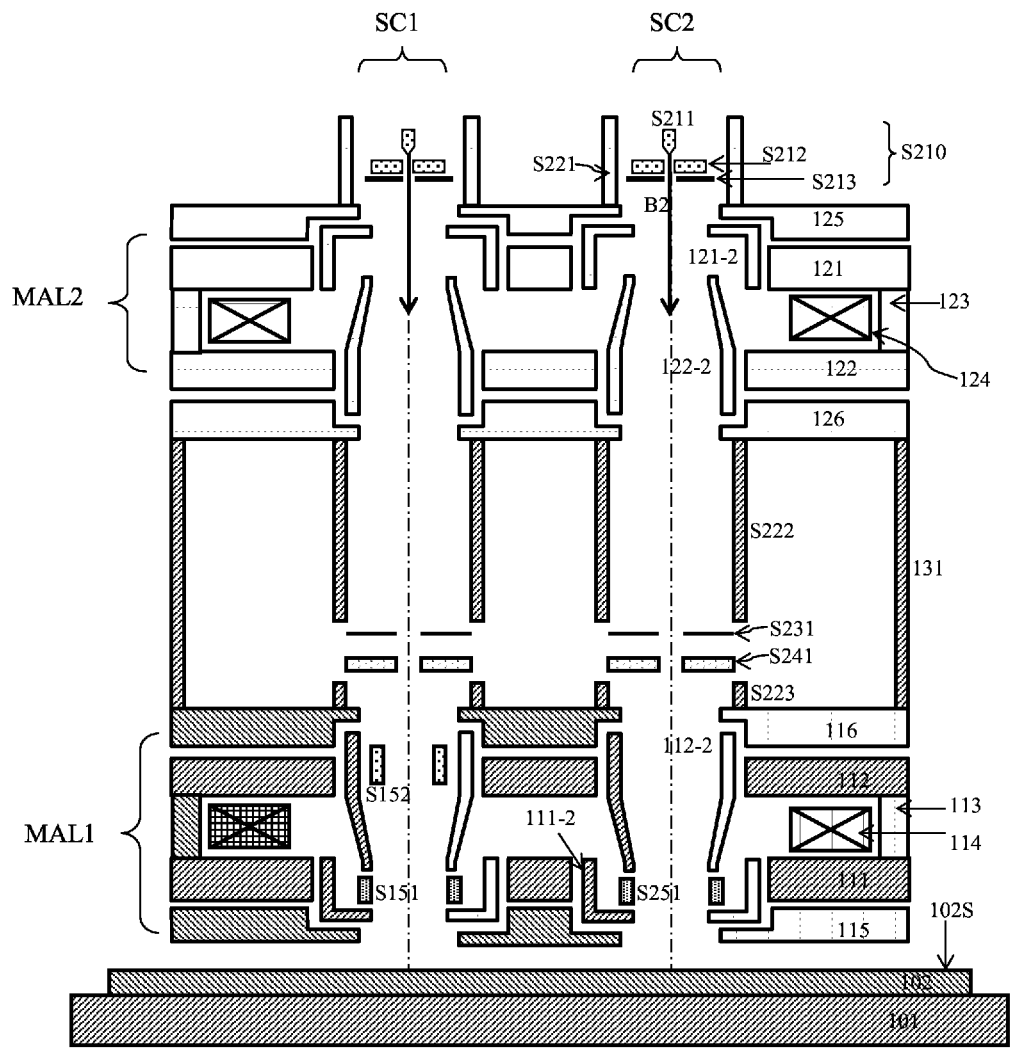
FIG. 4 is schematic illustration of a new apparatus of plural charged particle beams in accordance with one embodiment of the present invention.

One basic embodiment is first shown in FIG. 4. The apparatus A100 of plural electron beams comprises a plurality of sub-columns respectively working as a SEM with a single electron beam to observe an area on the surface 102S of the specimen 102 supported by the specimen stage 101. For the sake of simplification in demonstration, the one with only two sub-columns SC1 and SC2 is expressed for an example. Each sub-column comprises a single electron-source unit, a condenser lens, a beam-limit aperture, a signal-electron detector, a scanning deflector and an objective lens. For all the sub-columns, each of the objective lenses is formed by one magnetic sub-lens of the modified multi-axis magnetic objective lens MAL1 and each of the condenser lenses is formed by one magnetic sub-lens of the modified multi-axis magnetic condenser lens MAL2.

In the modified multi-axis magnetic objective lens MAL1 the common excitation coil 114 is surrounded by the yoke 113 and the pair of parallel magnetic conductor plates 111 and 112 with a plurality of pairs of through holes. It provides magnetic flux to two magnetic sub-lenses MAL1-1 and MAL1-2 functioning as the objective lenses in the sub-columns SC1 and SC2 respectively. For each magnetic sub-lens, the upper and lower magnetic rings (such as 112-2 and 111-2) form an axial magnetic-circuit gap. The upper and lower magnetic shielding plates 116 and 115 effectively reduce the magnetic flux in the areas respectively above and below the lens MAL1.

In the modified multi-axis magnetic condenserlens MAL2, the common excitation coil 124 is surrounded by the yoke 123 and the pair of parallel magnetic conductor plates 121 and 122 with a plurality of pairs of through holes. It provides magnetic flux to two magnetic sub-lenses MAL2-1 and MAL2-2 functioning as the condenser lenses in the sub-columns SC1 and SC2 respectively. For each magnetic sub-lens, the upper and lower magnetic rings (such as 121-2 and 122-2) forms an axial magnetic-circuit gap. The upper and lower magnetic shielding plates 125 and 126 effectively reduce the magnetic flux in the areas respectively above and below the lens MAL2.

Taking the sub-column SC2 as an example, inside its single electron-source unit S210, the cathode S211 is excited to emit a primary electron beam, the anode S212 is set at a voltage to accelerate the electrons of the primary electron (PE) beam and the gun aperture S213 only allows the center portion of the PE beam to pass through. In this way, the PE beam after the gun aperture S213, i.e. the PE beam B2, can provide a high brightness and a suitable beam current which can cover the desired range of the probe current. Then, the condenser lens (i.e. the magnetic sub-lens MAL2-2) focuses the PE beam B2 to have a desired current value (which is the probe current on the specimen surface 102S) after passing through the beam-limit aperture S231. After passing through the center through hole of the signal-electron detector S241, the PE beam B2 is focused by the objective lens (i.e. the magnetic sub-lens MAL1-2) onto the specimen surface 102S. The signal-electron detector S241 detects the secondary electrons (energy <50 eV) and/or backscattered electrons emitted from the surface due to the illumination of the focused PE-beam B2. The detected secondary electrons and backscattered electrons are related to topography, material composition and charge-up of the specimen surface 102S. The deflection scanning deflector S251 deflects the focused PE beam B2 to scan the specimen surface 102S so that an image thereof can be obtained. The image may comprise topography contrast, material contrast and voltage contrast (due to charge-up) simultaneously or individually. Therefore, the interested features (such as defect or particle) on the specimen surface 102S can be observed in the image.

To reduce the off-axis aberrations occurring during the PE beam scanning, the deflection field of the scanning deflector S251 is placed close to the round-lens field of the magnetic sub-lens MAL1-2 as much as possible. The off-axis aberrations can be further reduced if employing one more scanning deflector (such as the scanning deflector S152 in the sub-column SC1) to form a deflection scanning unit with the previous scanning deflector (such as the scanning deflector S151 in the sub-column SC1).

To further reduce or even eliminate the magnetic flux the multi-axis magnetic lenses MAL1 and MAL2 generated in the areas therebetween and above the later, three magnetic shielding tubes are used in each sub-columns For example, in the sub-column SC2, the first one S221 stands on the upper magnetic shielding plate 125 of the MAL2 to especially cover the single electron-source unit S210, the second one S222 is placed beneath the lower magnetic shielding plate 126 of the MAL2, and the third one S223 stands on the upper magnetic shielding plate 116 of the MAL1. The gap between the second and third ones is kept for the selection and/or maintenance of the beam-limit aperture plate S231 and the signal-electron detector S241. The beam-limit aperture is typically one opening on a selectable beam-limit aperture plate S231 which may comprise more than one opening with different radial sizes. For a specific application case, the selectable beam-limit aperture plate S231 may be moved to align the opening with a specific radial size with the optical axis of the sub-column SC2 so as to get a better image. The signal-electron detector S241 may need replacement or routine maintenance. To reduce the magnetic flux leaked out to the path of the PE beam B2 through the gap between the second and the third magnetic shielding tubes S222 and S223, a large magnetic shielding tube 131 is placed enclose the area between the MAL1 and MAL2.

Figure 5A:
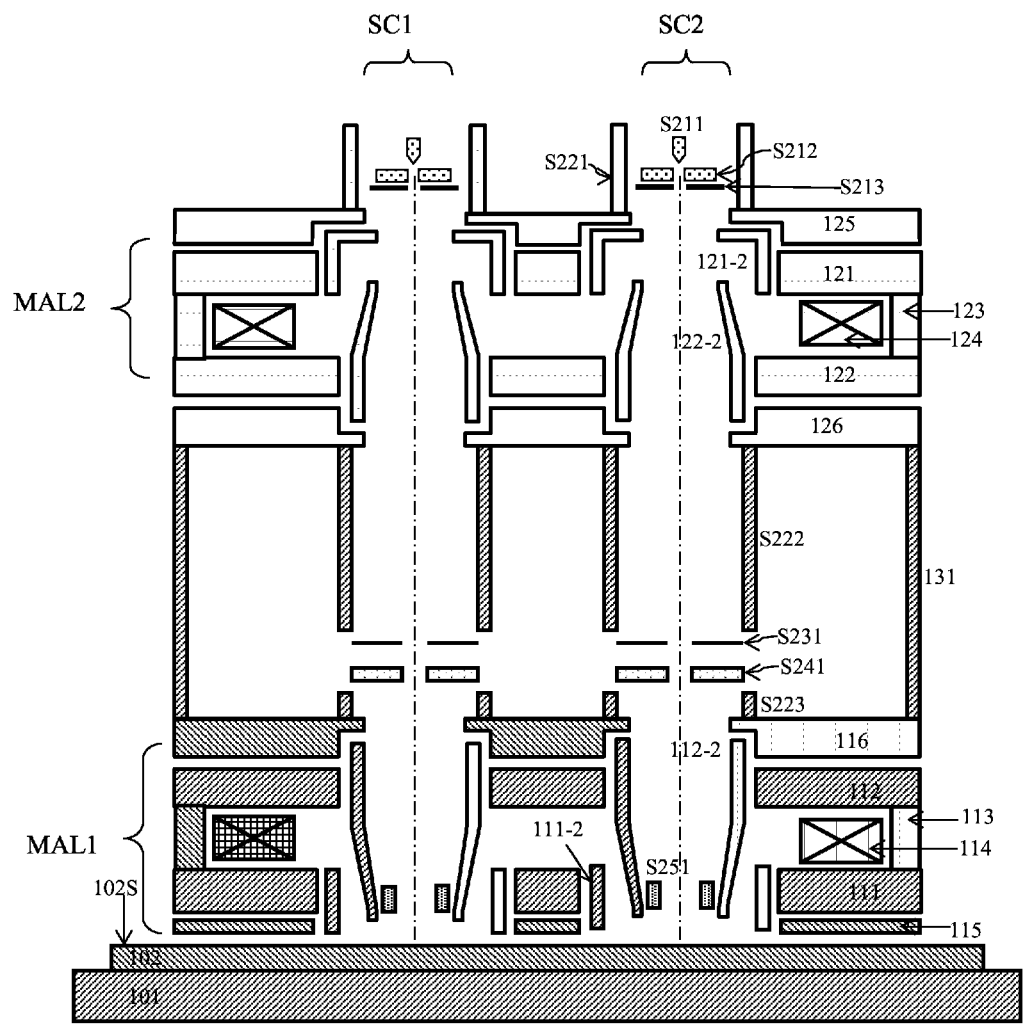
FIGS. 5A-5D are schematic illustrations of some variations of the objective lens and/or the condenser lens in accordance with the embodiment shown in FIG. 4.
Figure 5B:
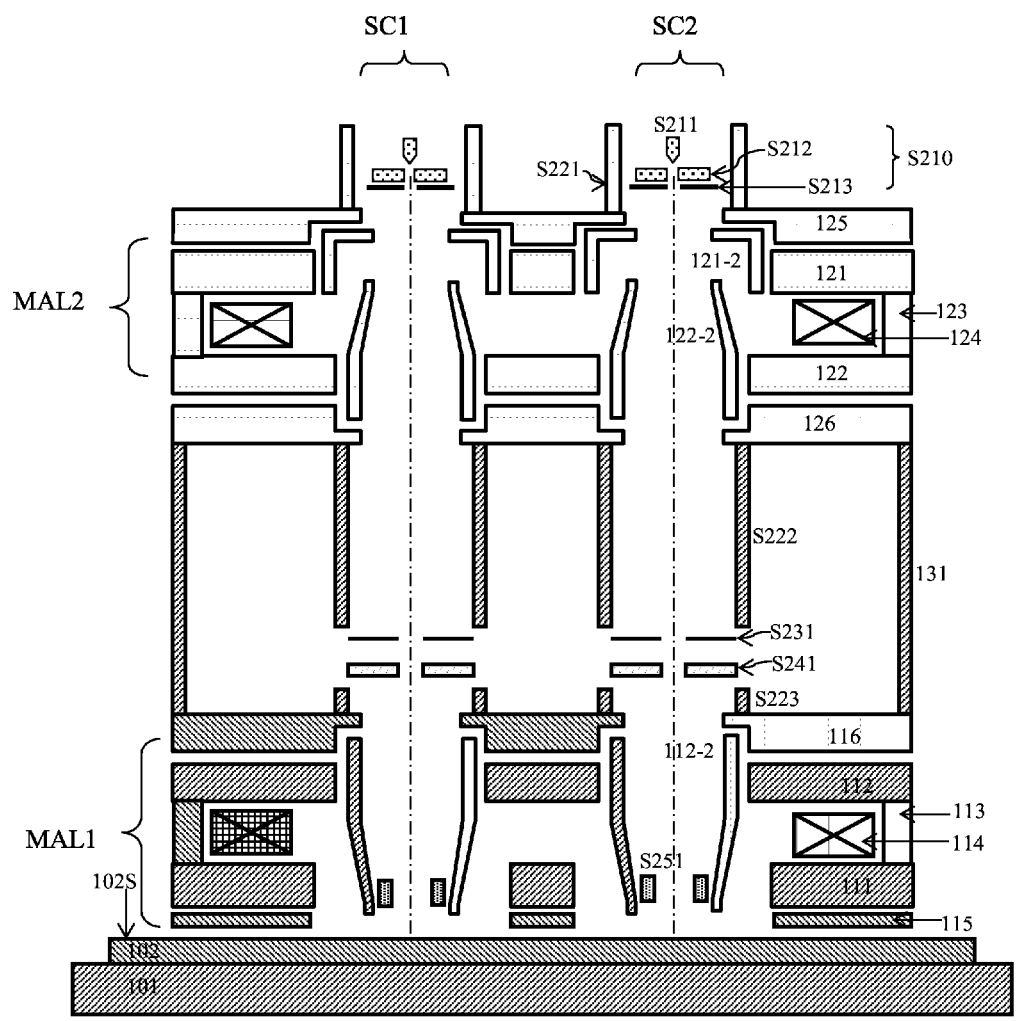

For some applications where the specimen is non-magnetic and can survive an immersion of a magnetic field, the on-axis aberrations (spherical aberration and chromatic aberration) of the magnetic sub-lenses MAL1-1 and MAL1-2 can be further reduced by making the magnetic fields thereof immerse the specimen surface 102S. This will obviously decrease the probe spot size, i.e. the size of the PE beam B2 on the specimen surface 102S, and thereby improving the resolution of the image. For the MAL1 in the apparatus A100-1 of plural electron beams shown in FIG. 5A, the upper and lower magnetic rings (such as 112-2 and 111-2) in each magnetic sub-lens are configured to form a radial magnetic-circuit gap closely facing the specimen surface 102S. In this way, the magnetic flux leaking through the radial magnetic-circuit gap of each magnetic sub-lens can strongly immerse the specimen surface 102S. If the upper magnetic ring 112-2 in FIG. 5A fully crosses over the corresponding lower hole and is placed with a short working distance, the corresponding lower magnetic ring 111-2 therefore can be removed for the sake of simplification in manufacturing, as the MALI in the apparatus A100-2 of plural electron beams shown in FIG. 5B.

Figure 5C:
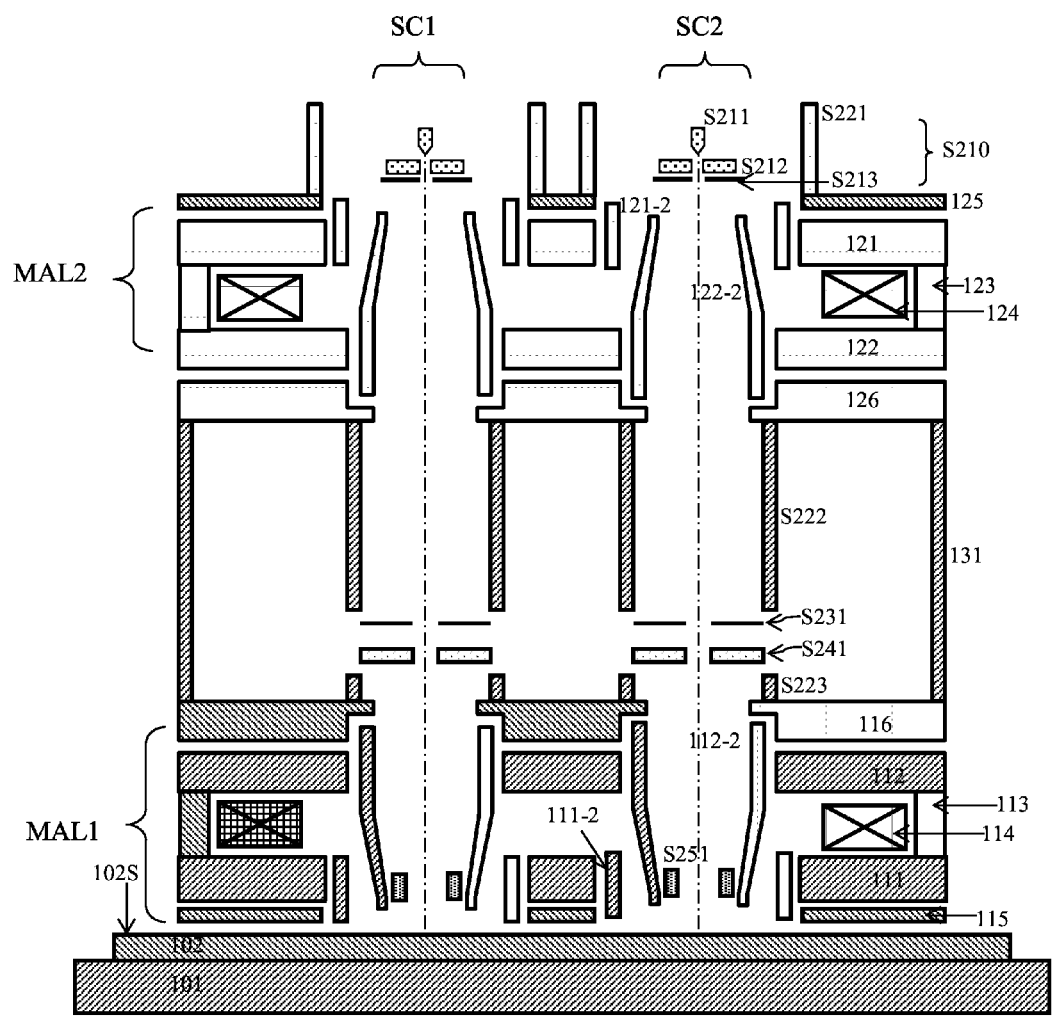

For some applications where large probe currents are necessary, the on-axis aberrations of the magnetic sub-lenses MAL2-1 and MAL2-2 will dominate the probe spot size as well as the Coulomb effect. To reduce the on-axis aberrations in these cases, each of the magnetic sub-lenses MAL2-1 and MAL2-2 can be configured to make the magnetic field thereof immerse the cathode (such as S211) of the corresponding single electron-source unit (such as S210). For the MAL2 in the apparatus A100-3 of plural electron beams shown in FIG. 5C, the upper and lower magnetic rings (such as 121-2 and 122-2) in each magnetic sub-lens are configured to form a radial magnetic-circuit gap closely facing the gun aperture (such as S213) of the corresponding single electron-source unit (such as S210). In this way, the magnetic flux leaking through the radial magnetic-circuit gap of each magnetic sub-lens can strongly immerse the cathode of the corresponding single electron-source unit.

Figure 3:
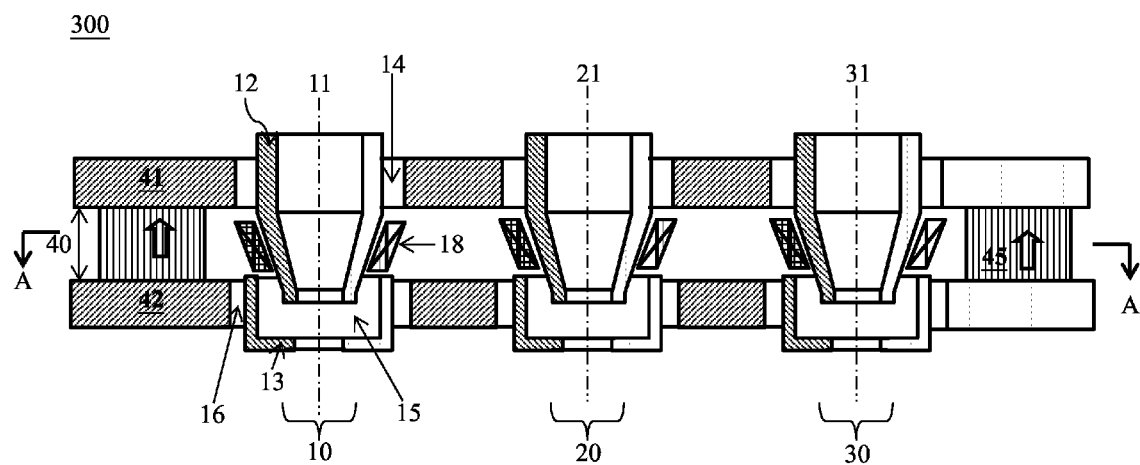
FIG. 3 is a schematic illustration of another modified multi-axis magnetic lens proposed in the third application of the cross-reference.
Figure 5D:
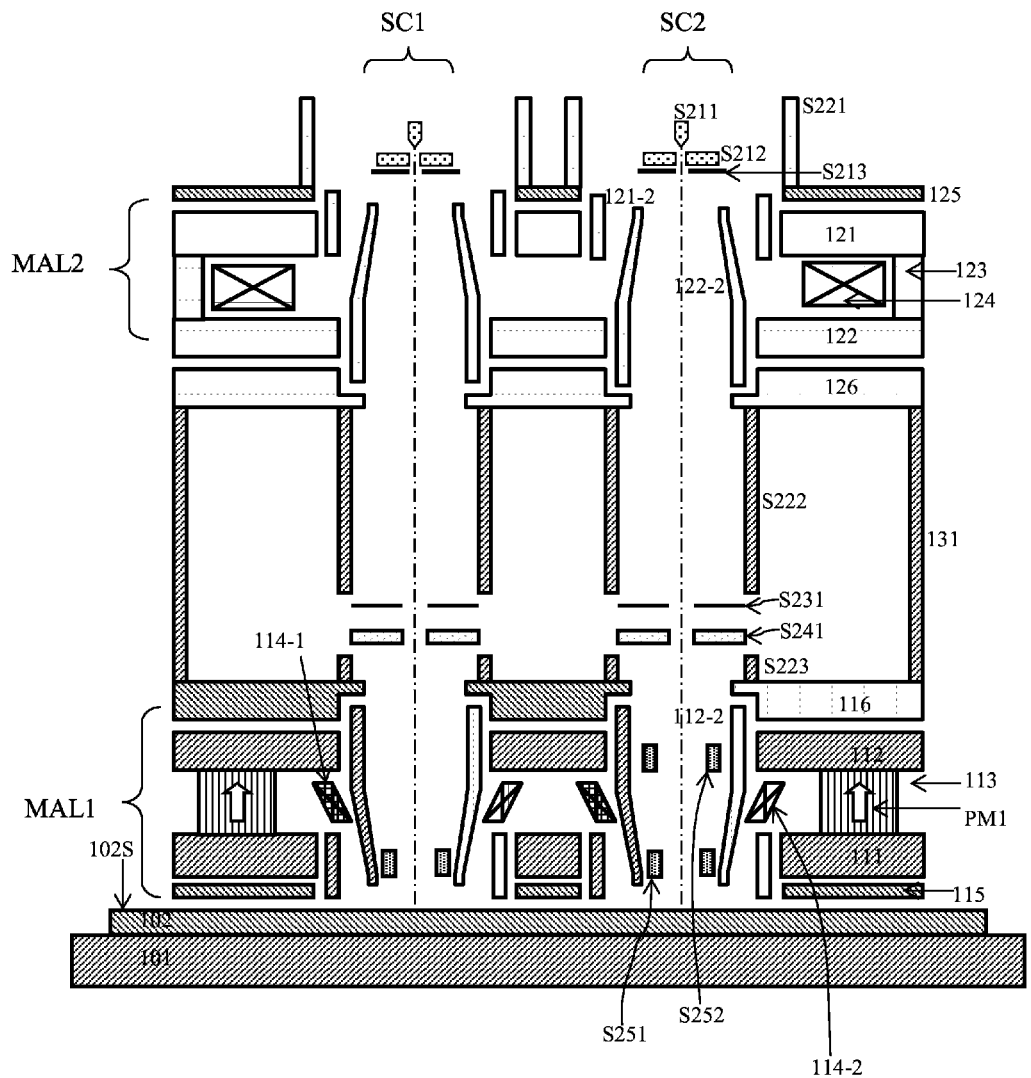

Either or both of the MAL1 and MAL2 can also be a modified multi-axis magnetic lens with a permanent magnet, similar to the one shown in FIG. 3. In FIG. 5D, the MAL1 uses the permanent magnet PM1 to provide the basic magnetic flux to the magnetic sub-lens MAL1-1 and MAL1-2. The sub-coils 114-1 and 114-2 are excited to provide the additional magnetic flux to the magnetic sub-lenses MAL1-1 and MAL1-2 respectively. In this way the focusing powers of the magnetic sub-lenses MAL1-1 and Mal1-2 can be adjusted within a specific range by varying the excitation current of the sub-coils 114-1 and 114-2 respectively.

For an apparatus of plural electron beams with multi-functions required for observing a specimen surface (such as both high-throughput inspection and high-resolution review of interested features thereon) as disclosed in the second application of the cross reference, a multi-axis magnetic condenser lens can also be employed to further improve resolutions and throughputs of the corresponding functions. Compared with the prior art of the yield management, wherein each of the multi-functions is realized in an individual single-function apparatus of a single beam or plural electron beams, a single apparatus of plural electron beams with multi-functions can provide a much higher throughput with a much lower cost.

Figure 6A:
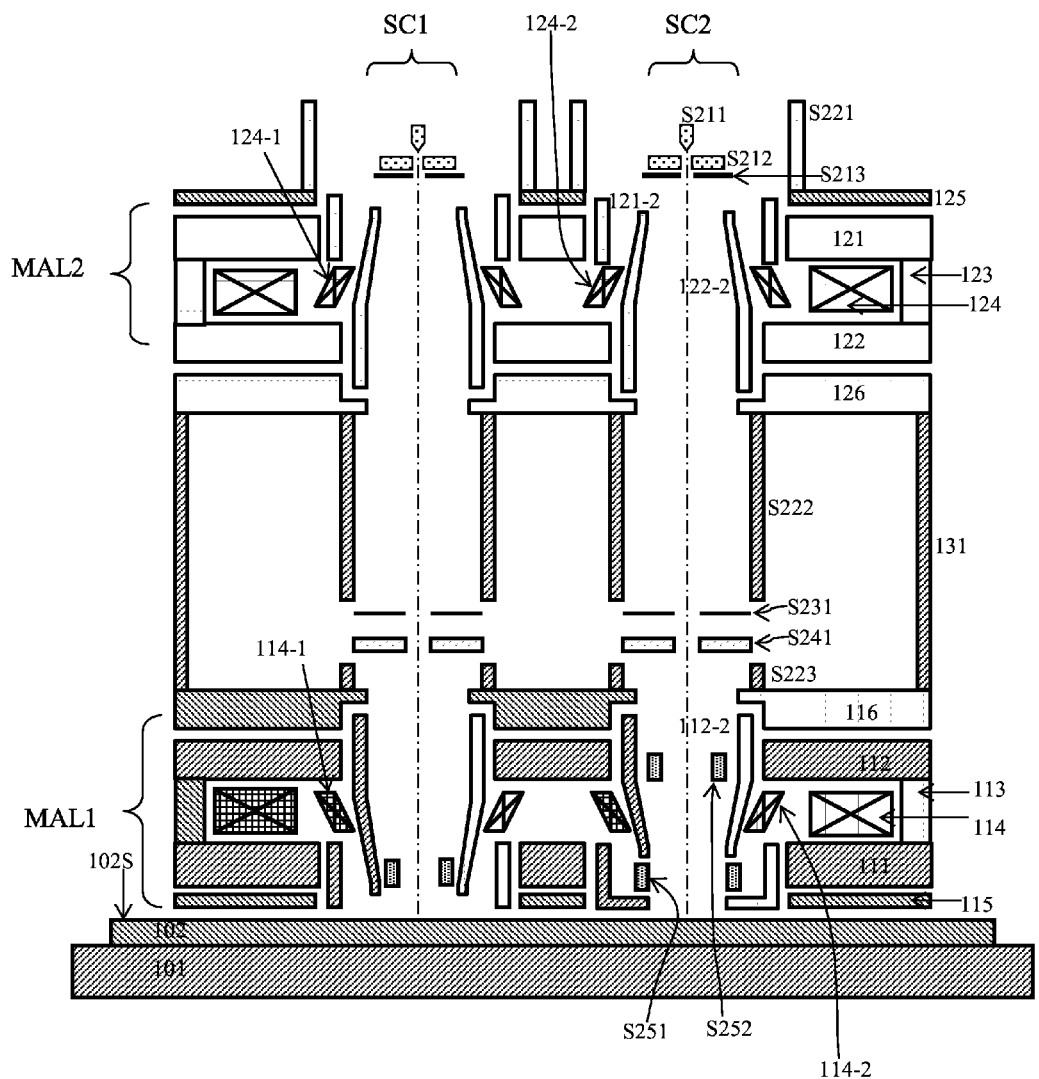
FIG. 6A is a schematic illustration of a new apparatus of plural charged particle beams in accordance with another embodiment of the present invention.

Please refer to FIG. 6A, the two sub-columns SC1 and SC2 in the apparatus A200 of plural electron beams with multi-functions can respectively perform high-resolution review and high-throughput inspection of the interested features on the specimen surface 102S. To do so, for the modified multi-axis magnetic objective lens MALE the sub-lens MAL1-1 with a radial magnetic-circuit gap works as the magnetic strong-immersion objective lens of the sub-column SC1 with small on-axis aberrations for providing a small probe spot size, while the sub-lens MAL1-2 with an axial magnetic-circuit gap works as the magnetic weak-immersion objective lens of the sub-column SC2 with small off-axis aberrations for providing large field of view. Obviously, the required focusing powers of the sub-lens MAL1-1 and MALI-2 are different and can not be realized together by adjusting the excitation current of the common excitation coil 114 for all the application cases. Accordingly, the sub-coils 114-1 and 114-2 surrounding the upper magnetic rings of the sub-lens MAL1-1 and MALI-2 are employed here so as to compensate the excitation difference thereof.

Figure 6B:
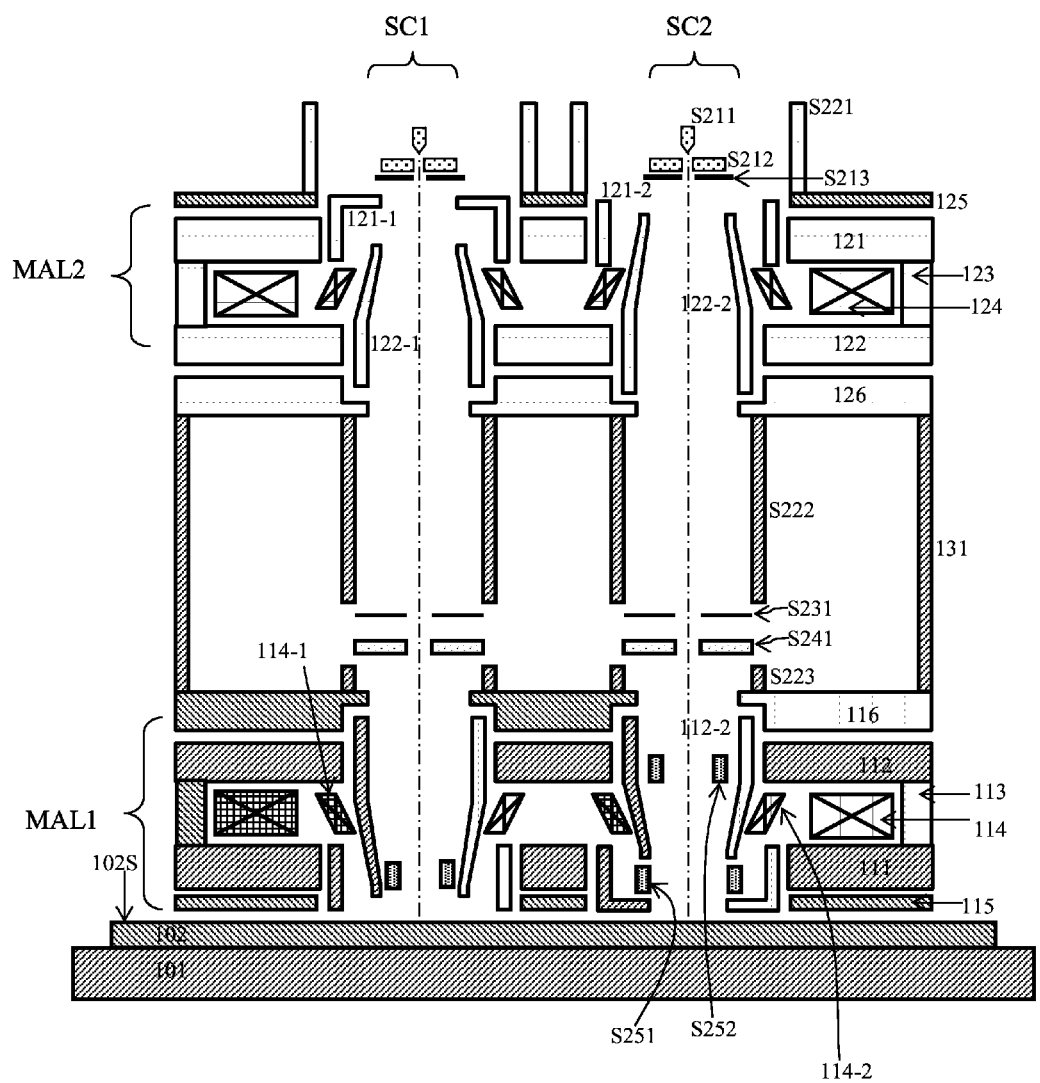
FIG. 6B is a schematic illustration of a variation of the condenser lens in accordance with the embodiment shown in FIG. 6A.

For the modified multi-axis magnetic condenser lens MAL2, the sub-lenses MAL2-1 and MAL2-2 both have radial magnetic-circuit gaps and respectively work as the magnetic strong-immersion condenser lenses of the sub-columns SC1 and SC2. In each sub-column, the probe current changes with the size of the beam-limit aperture and the focusing power of the magnetic condenser. Because the sub-column SC1 for high-resolution review typically works with small probe currents and the sub-column SC2 for high-throughput inspection typically works with large probe currents, the sub-lenses MAL2-1 and MAL2-2 are usually required to work at different focusing powers which therefore can not be realized together by adjusting the excitation current of the common excitation coil 124. Accordingly, the sub-coil 124-1 and 124-2 surrounding the lower magnetic rings of the sub-lens MAL2-1 and MAL2-2 are employed here so as to compensate the excitation difference thereof for all the application cases. In the sub-column SC1, the magnetic condenser lens (the magnetic sub-lens MAL2-1) only weakly focuses the PE beam and therefore generates small aberrations. Hence, the magnetic strong-immersion may be not necessary for some application cases. Accordingly, the magnetic condenser lens can also be configured with an axial magnetic-circuit gap, as shown in FIG. 6B.

Figure 7:
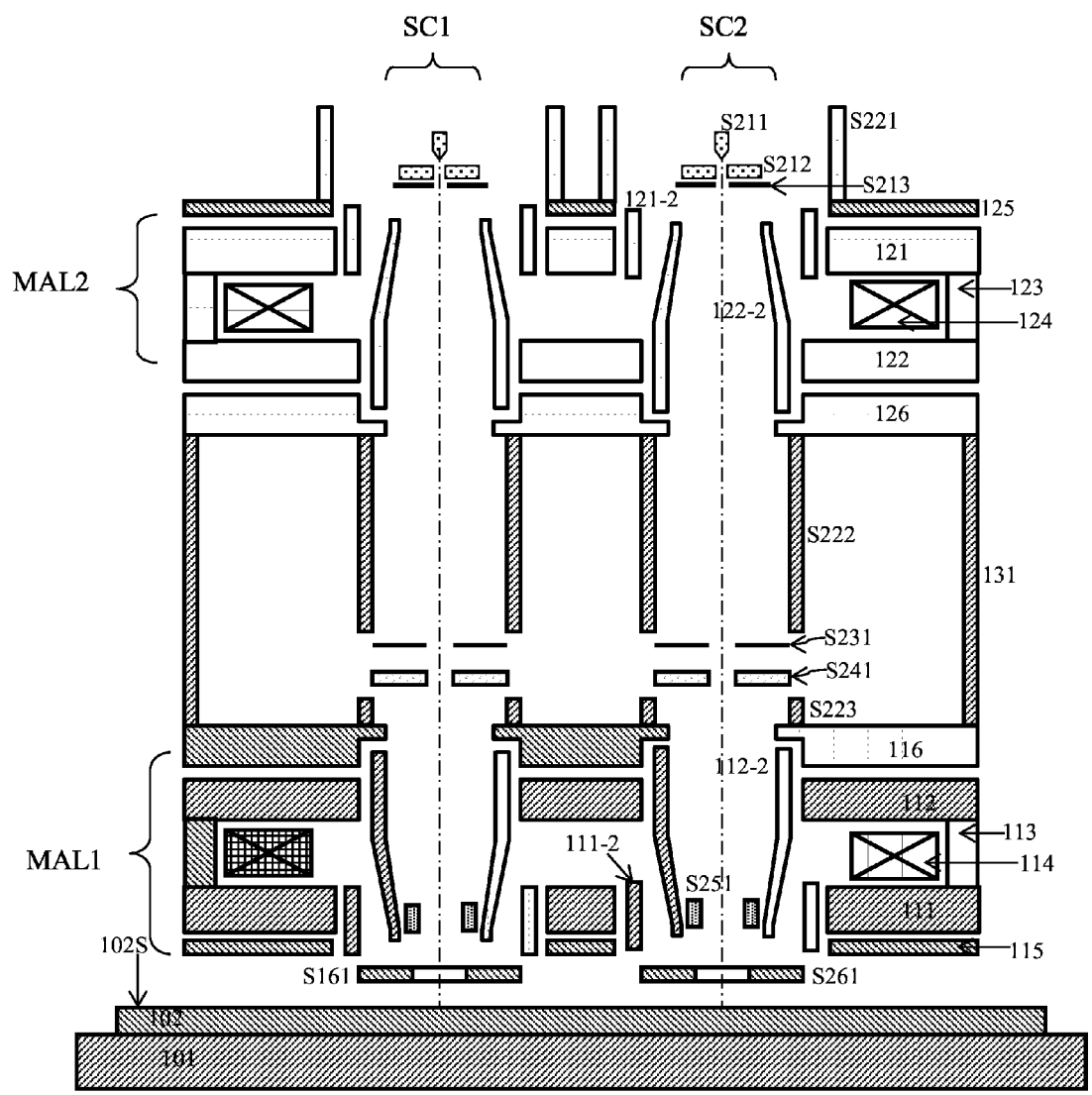
FIG. 7 is a schematic illustration of a new apparatus of plural charged particle beams in accordance with another embodiment of the present invention.

To further reduce the probe spot size so as to improve the image resolution in all the foregoing apparatuses, the conventional retarding technology (both the cathode and the specimen are negatively biased) and boosting technology (the cathode is negatively biased, and the specimen is ground) can also be used here. In both cases, the PE beam is initially accelerated to a high kinetic energy and subsequently decelerated to a low landing energy just prior to impinging onto the specimen. In this way, both of Coulomb effect and aberrations can be reduced to a great degree. The potential difference between the specimen and the element closest to the specimen will generate an electrostatic field on the specimen surface. This electrostatic field can be used to control charge-up situation on the specimen made of nonconductor materials and the collection ratio of the signal-electron detection. Therefore, the electrostatic field is better independently adjustable. To do so, a control electrode can be inserted between the specimen and magnetic objective lens of one sub-column. In FIG. 7, the control electrodes S161 and S261 each with a circular orifice are placed above the specimen surface 102S and below the sub-lens MAL1-1 and MAL1-2 respectively, and aligned with the optical axe thereof respectively. The potentials of the electrodes S161 and S261 can be adjusted with respect to the specimen 102 so as to provide the desired electrostatic fields respectively. Obviously, this method is also effective even if the retarding or boosting technology is not employed.

Figure 8:
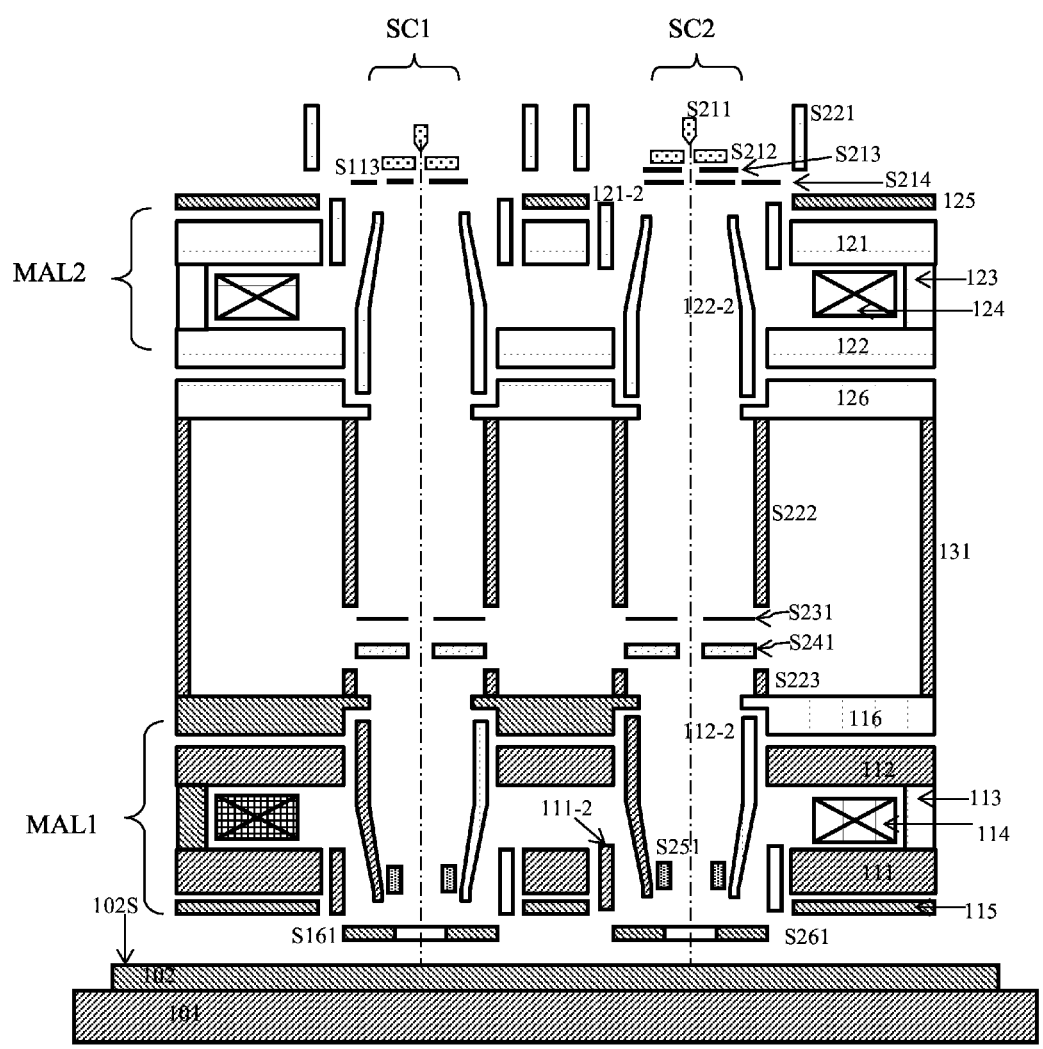
FIG. 8 is a schematic illustration of a new apparatus of plural charged particle beams in accordance with another embodiment of the present invention.

In each sub-column, the Coulomb effect due to the primary electrons not passing through the beam-limit aperture (i.e. the electrons not contributing to the probe current) can also be reduced or even eliminated by using a Coulomb-effect-limit aperture below the gun aperture. To cover the desired range of the probe current, usually the value of the PE beam current between the gun aperture and the beam-limit aperture is a little larger than the largest value of the probe current. For an application case with a small probe current, a large part of the PE beam current is not necessary. In this case, the size of the Coulomb-effect-limit aperture can be selected to limit the PE beam current flowing towards the beam-limit aperture. The Coulomb-effect-limit aperture is typically one opening on a selectable Coulomb-effect-limit aperture plate which comprises more than one opening with different radial sizes, such as the selectable Coulomb-effect-limit aperture plate S214 in the sub-column SC2 of the apparatus A300 shown in FIG. 8. For a specific application case, the selectable Coulomb-effect-limit aperture plate S214 can be moved to align the opening with a specific radial size with the optical axis of the sub-column SC2 so as to get a better image. Instead, if the gun aperture is one opening on a selectable gun aperture plate which comprises more than one opening with different radial sizes, the selectable Coulomb-effect-limit aperture plate is not necessary. In the sub-column SC1 of the apparatus A300 shown in FIG. 8, one of the openings on the selectable gun aperture plate S113 is aligned with the optical axis of the sub-column SC1 so as to function as a gun aperture.

In summary this invention proposes a new apparatus of plural charged particle beams with two modified multi-axis magnetic lenses, which comprises a plurality of sub-columns respectively working as a SEM with a single electron beam. Hence the apparatus can perform functions required for observing a surface of a specimen, such as high-throughput inspection and high-resolution review of interested features on the specimen surface, and accordingly can be used as a yield management tool in semiconductor manufacturing industry. In the apparatus, the magnetic sub-lenses of the two modified multi-axis magnetic lenses function as the objective lenses and the condenser lenses of all the sub-columns respectively. Compared with a prior-art yield management tool which employs one conventional multi-axis magnetic objective lens and one conventional multi-axis magnetic condenser lens, or employs one modified multi-axis magnetic objective lens and a plurality of electrostatic condenser lenses, the new apparatus can provide higher resolutions and higher throughputs. In addition, the sub-columns of the apparatus can perform same function or different functions required for observing a surface of a specimen. Compared with the conventional way for the yield management, wherein each of the multi-functions is realized in an individual single-function apparatus, a single apparatus with multi-functions can provide a much higher throughput with a much lower cost.

Although the present invention has been explained in relation to its preferred embodiment, it is to be understood that other modifications and variation can be made without departing the spirit and scope of the invention as hereafter claimed.

What is claimed is:

1. An apparatus of plural charged particle beams, comprising:
   a specimen stage for sustaining a specimen thereon; and
   multiple sub-columns above said specimen stage, wherein each of said multiple sub-columns performs a function for observing an observed surface of said specimen and comprises:
   a charged particle source unit for providing a primary charged particle beam propagating along an optical axis of said each sub-column;
   a magnetic condenser lens under said charged particle source unit and aligned with said optical axis;
   a beam-limit aperture plate having at least one first opening and under said magnetic condenser lens, wherein one of said at least one first opening is aligned with said optical axis and therefore functions as a beam-limit aperture;
   a signal-charged-particle detector under said beam-limit aperture plate; and
   a deflection scanning unit and a magnetic objective lens both under said signal-charged-particle detector and aligned with said optical axis,
   wherein said magnetic condenser lens focuses said primary charged particle beam to get a desired current thereof after passing through said beam-limit aperture, said magnetic objective lens focuses said primary charged particle beam onto said observed surface, said signal-charged-particle detector detects secondary charged particle beam emanated from said observed surface where said primary charged particle beam impinges, and said deflection scanning unit deflects said primary charged particle beam to scan said observed surface so that an image thereof can be obtained, wherein each of said magnetic objective lenses of said multiple sub-columns is one magnetic objective sub-lens of a multi-axis magnetic objective lens, wherein said multi-axis magnetic objective lens comprises:

a pair of parallel first magnetic conductor plates with a plurality of first through holes in pairs therein, wherein each pair of said first through holes comprises a first upper hole and a first lower hole which are respectively inside a first upper plate and a first lower plate of said pair of parallel first magnetic conductor plates and aligned with said optical axis of said each sub-column;

a plurality of first magnetic round rings in pairs, wherein each pair of said first magnetic round rings comprises a first upper ring and a first lower ring which are inside, aligned and form a first upper radial gap and a first lower radial gap with said first upper and lower holes of one pair of said first through holes respectively, and said first upper and lower radial gaps are vacuum or filled of non-magnetic or weakly-magnetic material; and a first annular magnetic-flux excitation unit which is between said first upper and lower plates and has an inner outline which encloses said plurality of first through holes in pairs in radial dimensions, wherein one pair of said first through holes, one pair of said first magnetic round rings therein and a first magnetic-circuit gap between said first upper and lower rings thereof therefore forms one magnetic objective sub-lens module, and said first annular magnetic-flux excitation unit provides a first magnetic flux to each magnetic objective sub-lens module which therefore becomes said one magnetic objective sub-lens, wherein each of said magnetic condenser lenses of said multiple sub-columns is one magnetic condenser sub-lens of a multi-axis magnetic condenser lens, wherein said multi-axis magnetic condenser lens comprises:

a pair of parallel second magnetic conductor plates with a plurality of second through holes in pairs therein, wherein each pair of said second through holes comprises a second upper hole and a second lower hole which are respectively inside a second upper plate and a second lower plate of said pair of parallel second magnetic conductor plates and aligned with said optical axis of said each sub-column;

a plurality of second magnetic round rings in pairs, wherein each pair of said second magnetic round rings comprises a second upper ring and a second lower ring which are inside, aligned and form a second upper radial gap and a second lower radial gap with said second upper and lower holes of one pair of said second through holes respectively, and said second upper and lower radial gaps are vacuum or filled of non-magnetic or weakly-magnetic material; and a second annular magnetic-flux excitation unit which is between said second upper and lower plates and has an inner outline which encloses said plurality of second through holes in pairs in radial dimensions, wherein one pair of said second through holes, one pair of said second magnetic round rings therein and a second magnetic-circuit gap between said second upper and lower rings thereof therefore forms one magnetic condenser sub-lens module, and said second annular magnetic-flux excitation unit provides a second magnetic flux to each magnetic condenser sub-lens module which therefore becomes said one magnetic condenser sub-lens.

2. The apparatus of plural charged particle beams according to claim 1, wherein for said each sub-column, a lower end of said first upper ring extends downward into said first lower ring and therefore makes said first magnetic-circuit gap close to said observed surface.

3. The apparatus of plural charged particle beams according to claim 2, wherein for said each sub-column, an upper end of said second lower ring extends upward into said second upper ring and therefore makes said second magnetic-circuit gap close to said charged particle source unit.

4. The apparatus of plural charged particle beams according to claim 3, further comprising a first upper magnetic-shielding plate which is placed above said first upper plate with a first upper axial gap and has a plurality of first upper through circular openings each aligned with said optical axis of said each sub-column so as to reduce high order harmonics of said each magnetic objective sub-lens.

5. The apparatus of plural charged particle beams according to claim 4, further comprising a first lower magnetic-shielding plate which is placed below said first lower plate with a first lower axial gap and has a plurality of first lower through circular openings each aligned with said optical axis of said each sub-column so as to reduce high order harmonics of said each magnetic objective sub-lens.

6. The apparatus of plural charged particle beams according to claim 5, further comprising a second upper magnetic-shielding plate which is located above said second upper plate with a second upper axial gap and has a plurality of second upper through circular openings each aligned with said optical axis of said each sub-column so as to reduce high order harmonics of said each magnetic condenser sub-lens.

7. The apparatus of plural charged particle beams according to claim 6, further comprising an second lower magnetic-shielding plate which is located below said second lower plate with a second lower axial gap and has a plurality of second lower through circular openings each aligned with said optical axis of said each sub-column so as to reduce high order harmonics of said each magnetic condenser sub-lens.

8. The apparatus of plural charged particle beams according to claim 7, wherein said each sub-column comprises a first magnetic-shielding tube which stands on said second upper magnetic-shielding plate and is aligned with said optical axis of said each sub-column so as to magnetically cover a portion of a path of said primary charged particle beam therein.

9. The apparatus of plural charged particle beams according to claim 8, wherein said each sub-column comprises a second magnetic-shielding tube which is placed beneath said second lower magnetic-shielding plate and aligned with said optical axis of said each sub-column so as to magnetically cover another portion of said path of said primary charged particle beam therein.

10. The apparatus of plural charged particle beams according to claim 9, wherein said each sub-column comprises a third magnetic-shielding tube which stands on said first upper magnetic-shielding plate and aligned with said optical axis of said each sub-column so as to magnetically cover another portion of said path of said primary charged particle beam therein.

11. The apparatus of plural charged particle beams according to claim 10, further comprising a general magnetic-shielding tube which is sandwiched by said first upper magnetic shielding plate and said second lower magnetic shielding plate so as to magnetically cover portions of paths of primary charged particle beams of all of said sub-columns therein.

12. The apparatus of plural charged particle beams according to claim 11, wherein for said each sub-column, said deflection scanning unit comprises an electrostatic deflector placed close to or inside said first magnetic-circuit gap.

13. The apparatus of plural charged particle beams according to claim 12, wherein said each sub-column comprises a control electrode placed above said observed surface, which has one circular orifice aligned with said optical axis of said each sub-column and is biased a control voltage with respect to said observed surface to control an electrostatic field thereon.

14. The apparatus of plural charged particle beams according to claim 13, wherein said each sub-column comprises a first sub-coil winding around said first upper ring and inside said first annular magnetic-flux excitation unit, which can be excited to provide a third magnetic flux to said magnetic objective sub-lens module.

15. The apparatus of plural charged particle beams according to claim 14, wherein said each sub-column comprises a second sub-coil winding around said second lower ring and inside said second annular magnetic-flux excitation unit, which can be excited to provide a fourth magnetic flux to said magnetic condenser sub-lens module.

16. The apparatus of plural charged particle beams according to claim 15, wherein said first annular magnetic-flux excitation unit comprises a first common coil.

17. The apparatus of plural charged particle beams according to claim 16, wherein said second annular magnetic-flux excitation unit comprises a second common coil.

18. The apparatus of plural charged particle beams according to claim 15, wherein said first annular magnetic-flux excitation unit comprises a first permanent magnet.

19. The apparatus of plural charged particle beams according to claim 15, wherein said second annular magnetic-flux excitation unit comprises a second permanent magnet.

20. The apparatus of plural charged particle beams according to claim 2, wherein said each sub-column comprises a first sub-coil winding around said first upper ring and inside said first annular magnetic-flux excitation unit, which can be excited to provide a third magnetic flux to said magnetic objective sub-lens module.

21. The apparatus of plural charged particle beams according to claim 1, wherein for each sub-column, an upper end of said second lower ring extends upward into said second upper ring and therefore makes said second magnetic-circuit gap close to said charged particle source unit.

22. The apparatus of plural charged particle beams according to claim 21, wherein said each sub-column further comprises a second sub-coil winding around said second lower ring and inside said second annular magnetic-flux excitation unit, which can be excited to provide a fourth magnetic flux to said magnetic condenser sub-lens module.

23. An apparatus of plural charged particle beams, comprising:
a specimen stage for sustaining a specimen thereon; and
multiple sub-columns above said specimen stage, wherein each of said multiple sub-columns performs a function for observing an observed surface of said specimen and comprises:
  a charged particle source unit for providing a primary charged particle beam propagating along an optical axis of said each sub-column;
  a magnetic condenser lens under said charged particle source unit and aligned with said optical axis;
  a beam-limit aperture plate having at least one first opening and under said magnetic condenser lens, wherein one of said at least one first opening is aligned with said optical axis and therefore functions as a beam-limit aperture;
  a signal-charged-particle detector under said beam-limit aperture plate; and
  a deflection scanning unit and a magnetic objective lens both under said signal-charged-particle detector and aligned with said optical axis,
  wherein said magnetic condenser lens focuses said primary charged particle beam to get a desired current thereof after passing through said beam-limit aperture, said magnetic objective lens focuses said primary charged particle beam onto said observed surface, said signal-charged-particle detector detects secondary charged particle beam emanated from said observed surface where said primary charged particle beam impinges and said deflection scanning unit deflects said primary charged particle beam to scan said observed surface so that an image thereof can be obtained,
wherein each of said magnetic objective lenses of said multiple sub-columns is one magnetic objective sub-lens of a multi-axis magnetic objective lens,
wherein said multi-axis magnetic objective lens comprises:
  a pair of parallel first magnetic conductor plates with a plurality of first through holes in pairs therein, wherein each pair of said first through holes comprises a first upper hole and a first lower hole which are respectively inside a first upper plate and a first lower plate of said pair of parallel first magnetic conductor plates and aligned with said optical axis of said each sub-column;
  a plurality of first magnetic round rings, wherein each of said first magnetic round rings is inside, aligned and forms a first upper radial gap with said first upper hole of one pair of said first through holes, and said first upper radial gap is vacuum or filled of non-magnetic or weakly-magnetic material; and
  a first annular magnetic-flux excitation unit which is between said first upper and lower plates and has an inner outline which encloses said plurality of first through holes in pairs in radial dimensions,
wherein one pair of said first through holes, one of said first magnetic round rings therein and a first magnetic-circuit gap between said first magnetic round ring and said first lower hole of said pair of first through holes therefore forms one magnetic objective sub-lens module, and said first annular magnetic-flux excitation provides a first magnetic flux to each magnetic objective sub-lens module which therefore becomes said one magnetic objective sub-lens, wherein each of said magnetic condenser lenses of said multiple sub-columns is one magnetic condenser sub-lens of a multi-axis magnetic condenser lens, wherein said multi-axis magnetic condenser lens comprises:

a pair of parallel second magnetic conductor plates with a plurality of second through holes in pairs therein, wherein each pair of said second through holes comprises a second upper hole and a second lower hole which are respectively inside a second upper plate and a second lower plate of said pair of parallel second magnetic conductor plates and aligned with said optical axis of said each sub-column, a plurality of second magnetic round rings in pairs, wherein each pair of said second magnetic round rings comprises a second upper ring and a second lower ring which are inside, aligned and form a second upper radial gap and a second lower radial gap with said second upper and lower holes of one pair of said second through holes respectively, and said second upper and lower radial gaps are vacuum or filled of non-magnetic or weakly-magnetic material, and a second annular magnetic-flux excitation unit which is between said second upper and lower plates and has an inner outline which encloses said plurality of second through holes in pairs in radial dimensions, wherein one pair of said second through holes, one pair of said second magnetic round rings therein and a second magnetic-circuit gap between said second upper and lower rings thereof therefore forms one magnetic condenser sub-lens module, and said second annular magnetic-flux excitation unit provides a second magnetic flux to each magnetic condenser sub-lens module which therefore becomes said one magnetic condenser sub-lens.

24. The apparatus of plural charged particle beams according to claim 23, wherein for one sub-column, a lower end of said first magnetic round ring extends downward into said first lower hole and therefore makes said first magnetic-circuit gap close to said observed surface.

25. The apparatus of plural charged particle beams according to claim 24, wherein said sub-column comprises a first sub-coil winding around said first magnetic round ring and inside said first annular magnetic-flux excitation unit, which can be excited to provide a third magnetic flux to said magnetic objective sub-lens module.

26. The apparatus of plural charged particle beams according to claim 23, wherein for one sub-column, an upper end of said second lower ring extends upward into said second upper ring and therefore makes said second magnetic-circuit gap close to said charged particle source unit.

27. The apparatus of plural charged particle beams according to claim 26, wherein said sub-column comprises a second sub-coil winding around said second upper ring and inside said second annular magnetic-flux excitation unit, which can be excited to provide a fourth magnetic flux to said magnetic condenser sub-lens module.

28. An apparatus of plural charged particle beams, comprising:

a specimen stage for sustaining a specimen thereon; and multiple sub-columns above said specimen stage, wherein each of said multiple sub-columns performs a function for observing an observed surface of said specimen and comprises:

a charged particle source unit for providing a primary charged particle beam propagating along an optical axis of said each sub-column;

a magnetic condenser lens under said charged particle source unit and aligned with said optical axis;

a beam-limit aperture plate having at least one first opening and under said magnetic condenser, wherein one of said at least first opening is aligned with said optical axis and therefore functions as a beam-limit aperture;

a signal-charged-particle detector under said beam-limit aperture plate; and a deflection scanning unit and a magnetic objective lens both under said signal-charged-particle detector and aligned with said optical axis, wherein said magnetic condenser lens focuses said primary charged particle beam to get a desired current thereof after passing through said beam-limit aperture, said magnetic objective lens focuses said primary charged particle beam onto said observed surface, said signal-charged-particle detector detects secondary charged particle beam emanated from said observed surface where said primary charged particle beam impinges and said deflection scanning unit deflects said primary charged particle beam to scan said observed surface so that an image thereof can be obtained, wherein each of said magnetic objective lenses of said multiple sub-columns is one magnetic objective sub-lens of a multi-axis magnetic objective lens, wherein said multi-axis magnetic objective lens comprises:

a pair of parallel first magnetic conductor plates with a plurality of first through holes in pairs therein, wherein each pair of said first through holes comprises a first upper hole and a first lower hole which are respectively inside a first upper plate and a first lower plate of said pair of parallel first magnetic conductor plates and aligned with said optical axis of said each sub-column;

a plurality of first magnetic round rings in pairs, wherein each pair of said first magnetic round rings comprises a first upper ring and a first lower ring which are inside, aligned and form a first upper radial gap and a first lower radial gap with said first upper and lower holes of one pair of said first through holes respectively, and said first upper and lower radial gaps are vacuum or filled of non-magnetic or weakly-magnetic material; and a first annular magnetic-flux excitation unit which is between said first upper and lower plates and has an inner outline which encloses said plurality of first through holes in pairs in radial dimensions, wherein one pair of said first through holes, one pair of said first magnetic round rings therein and a first magnetic-circuit gap between said first upper and lower rings thereof therefore forms one magnetic objective sub-lens module, and said first annular magnetic-flux excitation unit provides a first magnetic flux to each magnetic objective sub-lens module which therefore becomes said one magnetic objective sub-lens, wherein each of said magnetic condenser lenses of said multiple sub-columns is one magnetic condenser sub-lens of a multi-axis magnetic condenser lens, wherein said multi-axis magnetic condenser lens comprises:
  a pair of parallel second magnetic conductor plates with a plurality of second through holes in pairs therein, wherein each pair of said second through holes comprises a second upper hole and a second lower hole which are respectively inside a second upper plate and a second lower plate of said pair of parallel second magnetic conductor plates and aligned with said optical axis of said each sub-column;
  a plurality of second magnetic round rings, wherein each of said second magnetic round rings is inside, aligned and forms a second lower radial gap with said second lower hole of one pair of said second through holes, and said second lower radial gap is vacuum or filled of non-magnetic or weakly-magnetic material; and
  a second annular magnetic-flux excitation unit which is between said second upper and lower plates and has an inner outline which encloses said plurality of second through holes in pairs in radial dimensions,
  wherein one pair of said second through holes, one of said second magnetic round rings therein and a second magnetic-circuit gap between said second magnetic round ring and said second upper hole of said pair of second through holes therefore forms one magnetic condenser sub-lens module, and said second annular magnetic-flux excitation unit provides a second magnetic flux to each magnetic condenser sub-lens module which therefore becomes said one magnetic condenser sub-lens.

29. The apparatus of plural charged particle beams according to claim 28, wherein for one sub-column, a lower end of said first upper ring extends downward into said first lower ring and therefore makes said first magnetic-circuit gap close to said observed surface.

30. The apparatus of plural charged particle beams according to claim 29, wherein said sub-column comprises a first sub-coil winding around said first upper ring and inside said first annular magnetic-flux excitation unit, which can be excited to provide a third magnetic flux to said magnetic objective sub-lens module.

31. The apparatus of plural charged particle beams according to claim 28, wherein for one sub-column, a upper end of said second magnetic round ring extends upward into said second upper hole and therefore makes said second magnetic-circuit gap close to said charged particle source unit.

32. The apparatus of plural charged particle beams according to claim 31, wherein said sub-column comprises a second sub-coil winding around said second magnetic round ring and inside said second annular magnetic-flux excitation unit, which can be excited to provide a fourth magnetic flux to said magnetic condenser sub-lens module.

33. A method to configure an apparatus of plural charged particle beams, comprising:
  providing a specimen stage for sustaining a specimen thereon; and
  providing multiple sub-columns above said specimen stage, wherein each of said multiple sub-columns performs a function for observing an observed surface of said specimen and comprises:
    a charged particle source unit for providing a primary charged particle beam propagating along an optical axis of said each sub-column;
    a magnetic condenser lens under said charged particle source unit and aligned with said optical axis;
    a beam-limit aperture plate having at least one first opening and under said magnetic condenser, wherein one of said at least one first opening is aligned with said optical axis and therefore functions as a beam-limit aperture;
    a signal-charged-particle detector under said beam-limit aperture plate;
    a deflection scanning unit and a magnetic objective lens both under said signal-charged-particle detector and aligned with said optical axis,
  wherein said magnetic condenser lens focuses said primary charged particle beam to get a desired current thereof after passing through said beam-limit aperture, said magnetic objective lens focuses said primary charged particle beam onto said observed surface, said signal-charged-particle detector detects secondary charged particle beam emanated from said observed surface where said primary charged particle beam impinges and said deflection scanning unit deflects said primary charged particle beam to scan said observed surface so that an image thereof can be obtained,
    wherein each of said magnetic objective lenses of said multiple sub-columns is one magnetic objective sub-lens of a modified multi-axis magnetic objective lens,
    wherein each of said magnetic condenser lenses of said multiple sub-columns is one magnetic condenser sub-lens of a modified multi-axis magnetic condenser lens.

* * * * *